United States Patent
Mori

[11] Patent Number: 5,600,279
[45] Date of Patent: Feb. 4, 1997

[54] VCO HAVING ADJUSTMENT FOR FLUCTUATIONS IN RELATION BETWEEN CONTROL VOLTAGE AND OUTPUT FREQUENCY

[75] Inventor: Kazuhiro Mori, Amagasaki, Japan

[73] Assignee: Mitsubishi Denki Kabushiki Kaisha, Tokyo, Japan

[21] Appl. No.: 481,083

[22] Filed: Jun. 7, 1995

[30] Foreign Application Priority Data

Sep. 8, 1994 [JP] Japan .................................. 6-214742

[51] Int. Cl.$^6$ .............................. H03C 3/22; H03L 7/099
[52] U.S. Cl. .................................. 331/36 C; 331/177 V; 332/124; 332/127; 332/136
[58] Field of Search .............................. 331/36 C, 177 V; 332/124, 136, 127

[56] References Cited

U.S. PATENT DOCUMENTS

| | | | |
|---|---|---|---|
| 4,392,113 | 7/1983 | Jackson | 331/36 C |
| 4,494,090 | 1/1985 | Popek et al. | 332/16 T |
| 4,736,169 | 4/1988 | Weaver et al. | 331/177 V |
| 5,254,958 | 10/1993 | Flach et al. | 331/177 V |
| 5,379,003 | 1/1995 | Bizen | 331/177 V |

FOREIGN PATENT DOCUMENTS

| | | |
|---|---|---|
| 2-252317 | 10/1990 | Japan . |
| 2274562 | 7/1994 | United Kingdom . |
| WO82/03510 | 10/1982 | WIPO . |

*Primary Examiner*—Siegfried H. Grimm
*Attorney, Agent, or Firm*—Sughrue, Mion, Zinn, Macpeak & Seas

[57] ABSTRACT

A VCO circuit has a voltage variable capacitance CVD2 connected in series with or in parallel to a condenser C3 connected in series with an inductance L1, which constitutes a resonator of the VCO circuit. An adjustment voltage VD2 is applied to a cathode of the voltage variable capacitance CVD2, such that the relation between a control voltage VD1 and an oscillation frequency f0 of the VCO circuit is electrically adjusted to improve the fabrication yield.

16 Claims, 10 Drawing Sheets

VCO HAVING ADJUSTMENT FOR FLUCTUATIONS IN RELATION BETWEEN CONTROL VOLTAGE AND OUTPUT FREQUENCY

FIELD OF THE INVENTION

This invention relates to frequency adjustment upon fabrication of a Voltage Controlled Oscillator (VCO) circuit, particularly when mounted in a Phase Locked Loop (PLL) circuit.

DESCRIPTION OF THE RELATED ART

FIG. 11 is a circuit diagram for explaining the theory of a clamp circuit described in "DESIGNING AND MOUNTING HIGH FREQUENCY CIRCUIT" (NIPPON HOSO SYUPPAN KYOKAI), P. 144. This circuit includes a transistor Tr as an active device, and an LC resonance circuit comprising condensers C1, C2, and C3 and an inductance L1. The resonance frequency f0 of the circuit can be represented approximately as follows:

$$f0 = \frac{1}{2\pi \sqrt{L1\,C}} \quad (1)$$

$$\text{where } C = \frac{C1 \cdot C2 \cdot C3}{C1C2 + C2C3 + C3C1}$$

FIG. 12 is a circuit diagram showing a VCO of the conventional clamp circuit type. The VCO circuit shown in FIG. 12 comprises bias resistors RA, RB, RC for the transistor Tr, condensers C1, C2, C3, C4, a variable capacitance diode CVD1, an inductance L1, a coil LA, a condenser CB, a resistor RD, and an output condenser CA. The capacitance of the diode CVD1 varies corresponding to a control voltage VD1 applied to a control terminal. The capacitance of the condenser CA is set so that it usually has a very large impedance at an oscillation frequency f0. The condenser CB has a satisfactorily low impedance at the oscillation frequency f0, and the resistor RD reduces the noise of a DC power supply Vcc. The coil LA causes an input terminal for the control voltage VD1 to present a high impedance. The oscillation frequency f0 of the VCO shown in FIG. 12 mainly depends on the condensers C1, C2, C3, C4, the variable capacitance diode CVD1, and the inductance L1.

FIG. 13 is an equivalent circuit diagram showing the components that mainly contribute to oscillation in FIG. 12. In FIG. 13, the oscillation frequency f0 depends on a capacitance of condensers C1, C2, C3, C4, and the variable capacitance diode CVD1, and the value of the inductance L1. FIG. 14 is an equivalent circuit diagram showing the components relating to resonance in FIG. 13. Thus, the oscillation frequency of FIG. 12 can be approximately represented as follows:

$$f0 = \frac{1}{2\pi \sqrt{L1\,C}} \quad (2)$$

$$\text{where } C = \frac{1}{\frac{1}{C1} + \frac{1}{C2} + \frac{1}{C3}} + \frac{1}{\frac{1}{C4} + \frac{1}{CVD1}}$$

The capacitance value of diode CVD1 decreases as the applied control voltage VD1 increases, and vice versa. Thus, the oscillation frequency f0 varies depending on the value of the applied control voltage VD1.

When the VCO oscillates at a frequency in the desired frequency band due to the voltage of the power supply, the control voltage VD1 should fall in a predetermined range.

FIG. 15 shows the relation between the oscillation frequency f0 and the control voltage VD1. In FIG. 15, fL~fH represent a desired range of oscillation frequencies. VL~VH represent a range of the control voltage VD1 required for the oscillation frequencies fL~fH. As can be seen, when VD1=VL, f0<fL, and when VD1=VH, f0>fH.

With the conventional VCO circuit constructed as described above, due to the manufacturing tolerance fluctuations of the condensers C1, C2, C3, C4, the variable capacitance diode CVD1, and so forth, when the control voltage VD1 is fixed, the oscillation frequency of each VCO circuit fluctuates. Thus, to satisfy the relation between the control voltage VD1 and the oscillation frequency f0 shown in FIG. 15 as a performance requirement, when the inductance L1 is, for example, a microstrip line, physical adjustments for the length of the microstrip line, the capacitance values of the condensers C1, C2, C3, and C4, and the like are required. A long adjustment time is thus required, and in addition the fabrication yield of the VCO circuits is low.

SUMMARY OF THE INVENTION

An object of the invention is thus to provide a VCO circuit that can electrically adjust the relation between the control voltage VD1 thereof and the oscillation frequency f0.

Another object of the invention is to provide a PLL circuit that can automatically adjust the relation between the control voltage VD1 and the oscillation frequency f0 when a VCO circuit is mounted in a PLL circuit.

A VCO circuit according to the invention has a first voltage variable capacitance device for varying a resonance frequency of a resonance circuit, and a second voltage variable capacitance device connected to a capacitance device connected in series with an inductance device that is a constructional element of the resonance circuit. An adjustment voltage is applied to the second voltage variable capacitance device to adjust fluctuations of the relation between the control voltage applied to the first voltage variable capacitance device and a resonance frequency of the resonance circuit.

A PLL circuit according to the invention comprises the VCO circuit described just above, a reference frequency oscillator for producing a reference frequency, a fixed-frequency divider for dividing the reference frequency; a variable frequency divider for dividing an oscillation frequency of the VCO circuit, a phase comparator for comparing the phase of the frequency divided by said variable frequency divider with the phase of the frequency divided by said fixed-frequency divider, a filter for applying a control voltage based on a smoothed output of said phase comparator to the first voltage variable capacitance device of the VCO circuit, and an adjusting circuit for comparing the predetermined voltage in the adjusting circuit with the control voltage applied by the filter and outputting the adjustment voltage to be applied to said second voltage variable capacitance device of the VCO circuit, so as to cause the control voltage applied by the filters to be a desired limit voltage.

BRIEF DESCRIPTION OF THE DRAWINGS

In all figures, the same and the substantially same elements are the same reference numbers.

DESCRIPTION OF PREFERRED EMBODIMENTS

Figure 1:
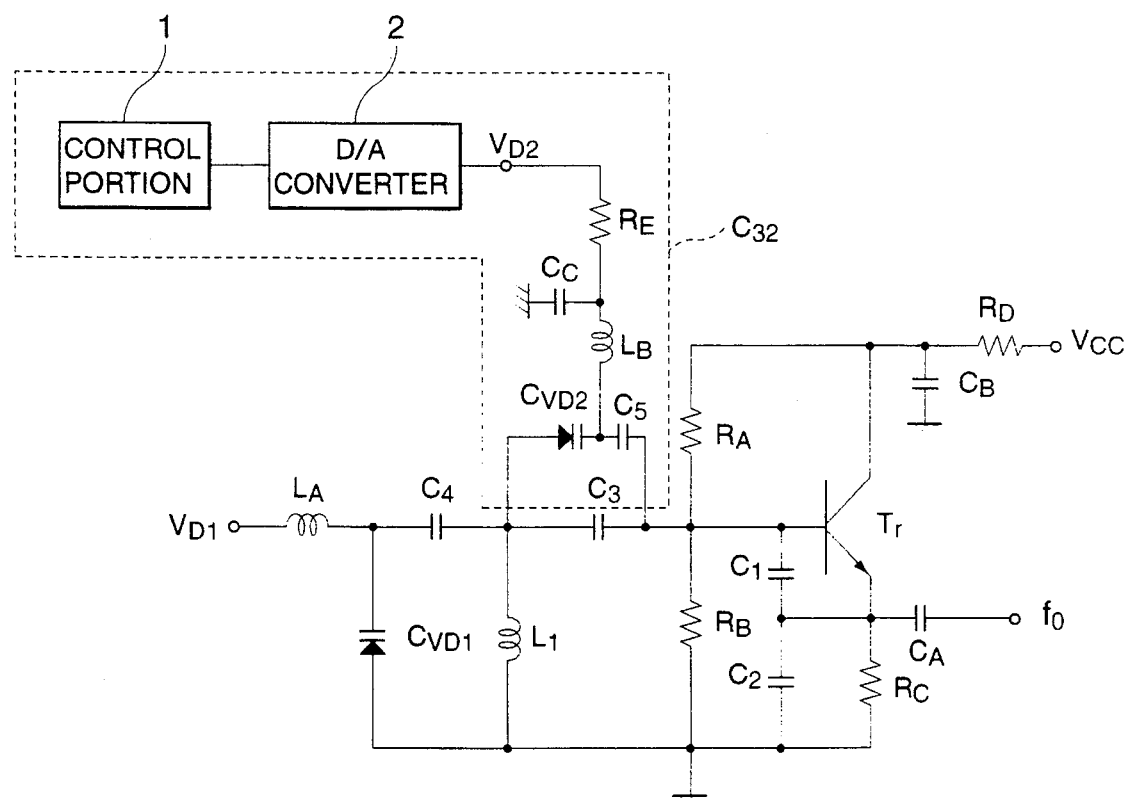
FIG. 1 is a VCO circuit diagram according to a first embodiment of the invention.
Figure 2:
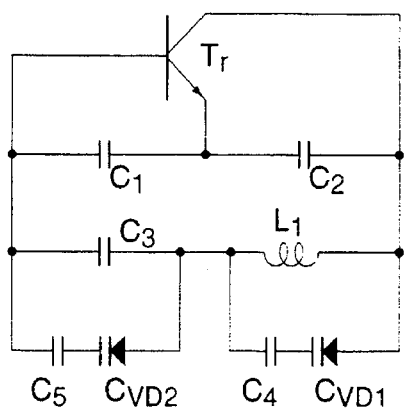
FIG. 2 is an equivalent circuit diagram showing an oscillating portion of the VCO circuit according to the first embodiment.
Figure 3:
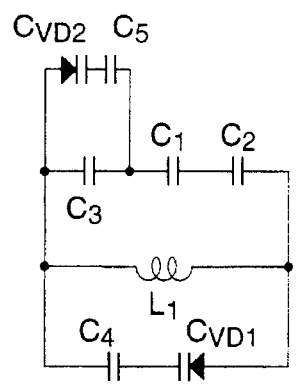
FIG. 3 is a circuit diagram showing a resonance circuit portion of the VCO circuit according to the first embodiment.
Figure 12:
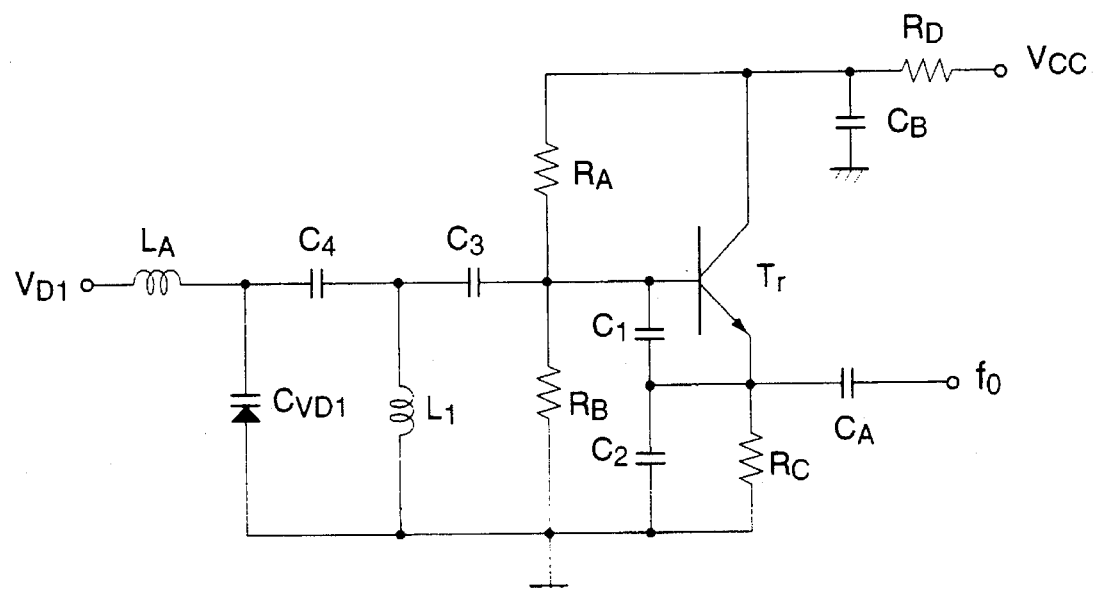
FIG. 12 is a conventional VCO circuit diagram.

FIG. 1 shows a VCO circuit of a first embodiment, wherein a capacitance adjusting circuit C32 is connected in parallel to the condenser C3 shown in FIG. 12. It comprises a DC power supply and a coil LB, wherein the DC power supply comprises a D/A converter 2 for outputting a predetermined DC adjustment voltage VD2 corresponding to data that is output from a control unit 1, and a resistor RE and condenser CC for reducing output noise of the D/A converter 2. The impedance of the Coil LB separates capacitance components of a condenser C5 connected in parallel with the condenser C3, and a variable capacitance diode CVD2 connected to the DC power supply, from the DC power supply. FIG. 2 shows the components that mainly contribute to the oscillation of the circuit shown in FIG. 1, and FIG. 3 shows the resonant circuit components of FIG. 2. Thus, the oscillation frequency f0 of the VCO circuit shown in FIG. 1 can be approximately represented by:

$$f0 = \frac{1}{2\pi\sqrt{L1\,C}} \quad (3)$$

where $C = \dfrac{1}{\frac{1}{C1} + \frac{1}{C2} + \frac{1}{C3 + C32}} + \dfrac{1}{\frac{1}{C4} + \frac{1}{CVD1}}$ $C32 = \dfrac{1}{\frac{1}{C5} + \frac{1}{CVD2}}$ .

Figure 4:
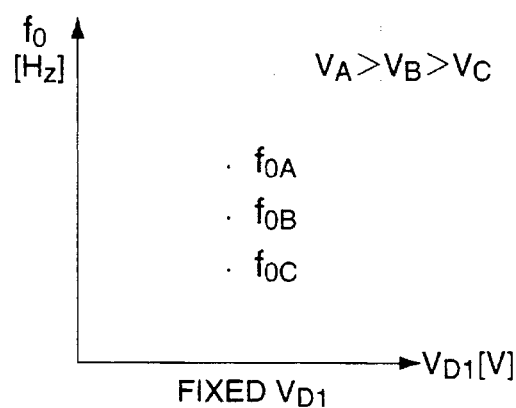
FIG. 4 is a schematic diagram for explaining the relation between an adjustment voltage and an oscillation frequency of the VCO circuit according to the first embodiment.

In Formula 3, when the control voltage VD1 is fixed and only the adjustment voltage VD2 is varied, the oscillation frequency f0 varies as shown in FIG. 4.

Now, assume that when the values of the adjustment voltage VD2 are VA, VB, and VC, the values of the variable capacitance diode CVD2 are CVD2A, CVD2B, and CVD2C, respectively, and that when the values of C in Formula 3 are CA, CB, and CC, the values of the oscillation frequency f0 are f0A, f0B, and f0C, respectively. In this case, when VA>VB>VC, since CVD2A<CVD2B<CVD2C, then CA <CB<CC. The oscillation frequencies corresponding to the values VA, VB, and VC of the adjustment voltage VD2 are f0A>f0B >f0C.

Figure 5:
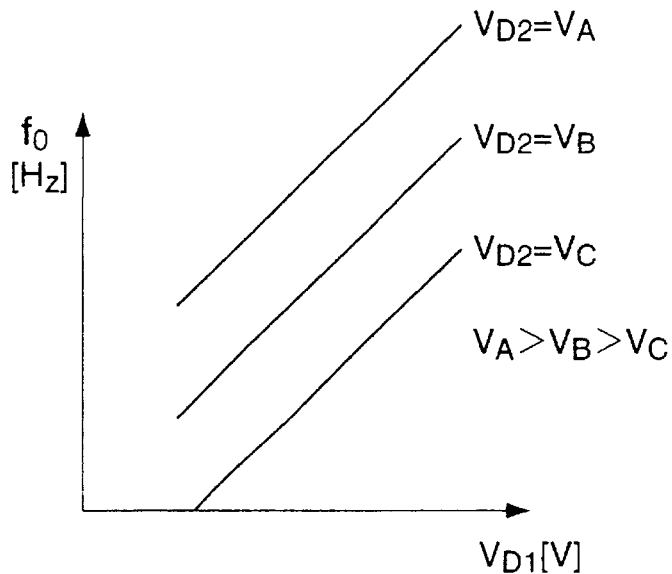
FIG. 5 is a schematic diagram for explaining the relation between a control voltage and an oscillation frequency against the adjustment voltage according to the first embodiment.

Thus, when the control voltage VD1 is varied as a parameter of the adjustment voltages VA, VB, and VC, the relation between the control voltage VD1 and the oscillation frequency f0 is shown in FIG. 5. In other words, the variable capacitance diode CVD2 is connected in parallel to the condensers C1~C3 connected in series in the VCO circuit of the clamp circuit shown in FIG. 3. When the adjustment voltage VD2 applied to the variable capacitance diode CVD2 is varied, the curves that represent the relation between the control voltage VD1 and the oscillation frequency f0 move nearly in parallel as shown in FIG. 5.

Figure 6:
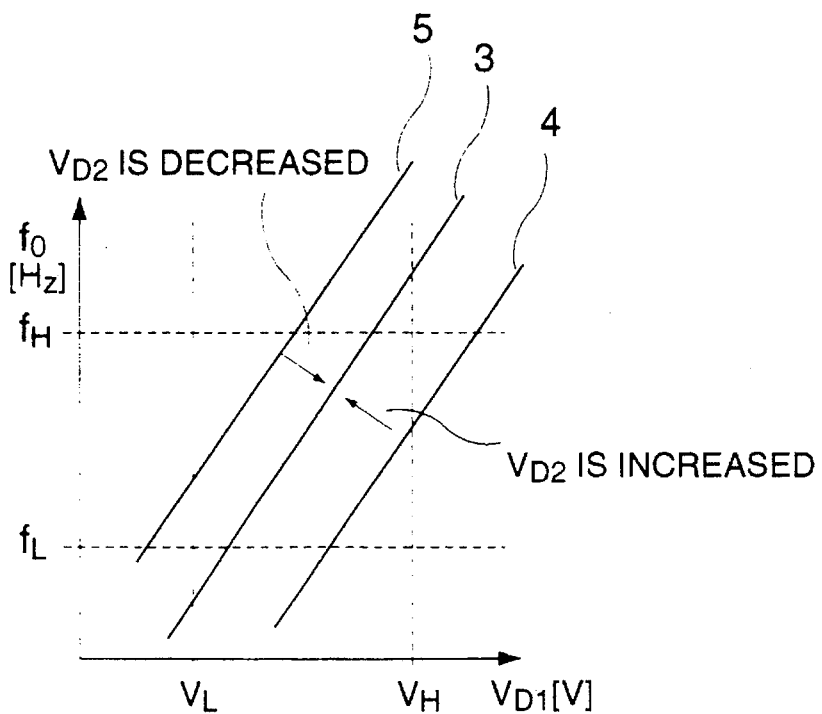
FIG. 6 is a schematic diagram for explaining a method for adjusting the relation between the control voltage and the oscillation frequency against the adjustment voltage of the VCO circuit according to the first embodiment.

When the VCO circuit is constructed as described above, the fluctuation of the relation between the control voltage VD1 and the oscillation frequency f0 due to fluctuations of the oscillating circuit components can be adjusted by the adjustment voltage VD2 applied to the variable capacitance diode CVD2. For example, as shown in FIG. 6, when the capability required for the VCO is f0<fH in the case of VD1=VL and f0>fH in the case of VD1=VH, the VCO may operate corresponding to curves 4 and 5 that do not satisfy the required specifications due to fluctuations of the components against a desired curve 3. In the case of curve 4, when the value of VD2 is increased, the VCO operates close to curve 3. In the case of curve 5, when the value of VD2 is decreased, the VCO also operates close to curve 3. Since VD2 depends on data that is input to the D/A converter 2 by the control unit 1, the frequency can be adjusted by changing only software without the need to perform physical frequency adjustment. The input data for the D/A converter 2 may be stored in a memory of the control unit.

Depending on the oscillation frequency, the standard required for the VCO, and so forth, the inductance L1 is selected from one of a coil, a microstrip line, a dielectric resonator, a SAW (surface elastic wave) resonator, a crystal resonator, and so forth. In any case, the inductance L1 does not have a pure inductance value or other component values. An inductance L1 other than a coil, employs an inductive region in the vicinity of a serial resonance point.

Figure 7:
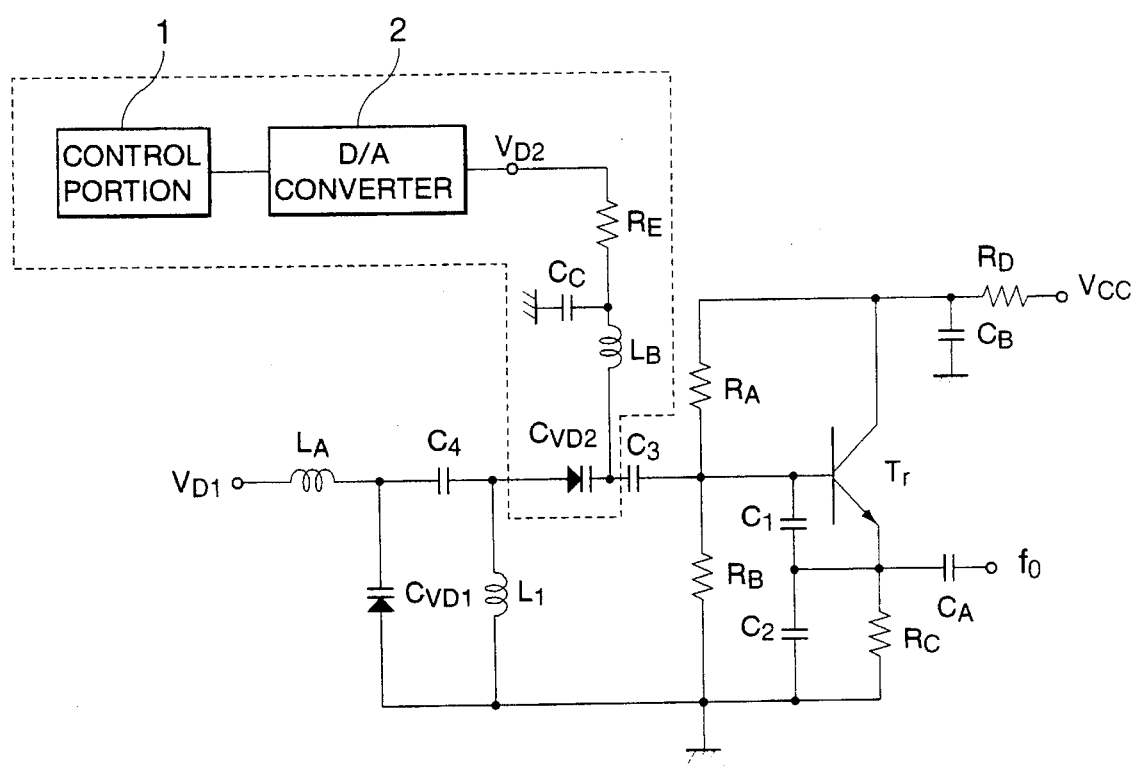
FIG. 7 is a VCO circuit diagram according to a second embodiment of the invention.

FIG. 7 shows a VCO circuit according to a second embodiment of the invention, wherein the variable capacitance diode CVD2 is connected in series with the condenser C3. The adjustment voltage VD2 is applied between the variable capacitance CVD2 and the condenser C3.

With this arrangement, when the adjustment voltage VD2 is varied, the value of the variable capacitance diode CVD2 varies. Thus, the capacitance value of the resonance circuit varies. Consequently, as with the case of the first embodiment, the curves that represent the relation between the control voltage VD1 and the oscillation frequency f0 can be moved in parallel. As a result, a similar effect can be accomplished.

In addition, in this embodiment, since the variable capacitor diode CVD2 is connected in series with the condenser C3, the condenser C5 shown in FIG. 5 can be omitted. Thus, the number of condensers can be reduced.

Figure 8:
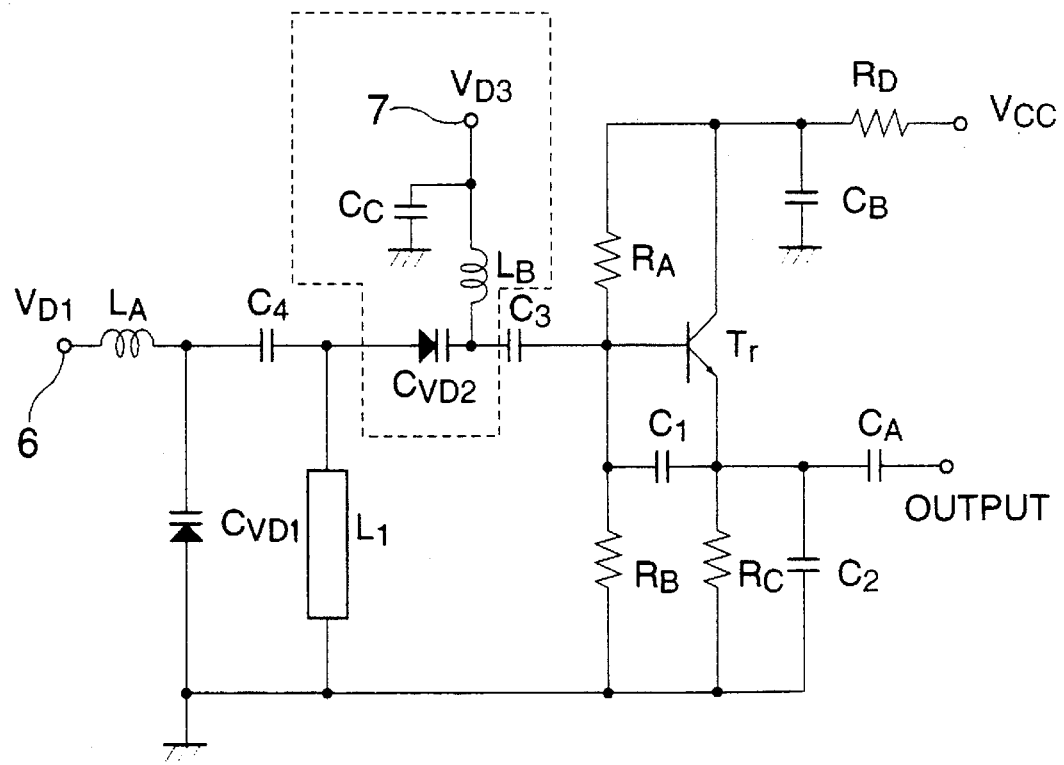
FIG. 8 is a VCO circuit diagram according to a third embodiment of the invention.

In the first and second embodiments, the VCO circuits that have a control unit 1 and a D/A converter 2 were described. A VCO circuit according to a third embodiment omits these components, as shown in FIG. 8. In FIG. 8, the control unit 1, the D/A converter 2, and the resistor RE are omitted from FIG. 7. The control voltage VD1 and the adjustment voltage VD3 are applied at a control terminal 6 and an adjustment terminal 7. In the VCO circuit, when a line test is performed, the relation between the adjusting voltage VD3 and the curves that represent the relation between the control voltage VD1 and the oscillation frequency f0 is determined. The adjustment voltage VD3 in which the predetermined relation is satisfied is thus obtained. The VCO circuit board displays the value of the adjustment voltage VD3. When the VCO circuit board is mounted to another device, if the displayed adjustment voltage VD3 of another power supply is applied, the VCO circuit can accomplish the predetermined capability.

Figure 13:
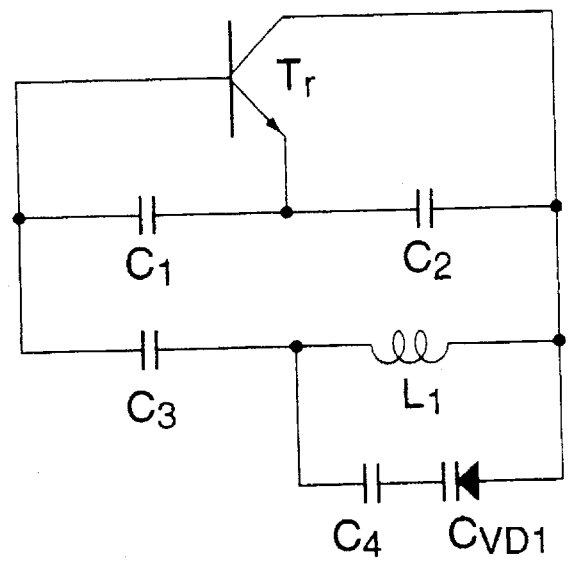
FIG. 13 is an equivalent circuit diagram showing an oscillating portion of the conventional VCO circuit.
Figure 14:
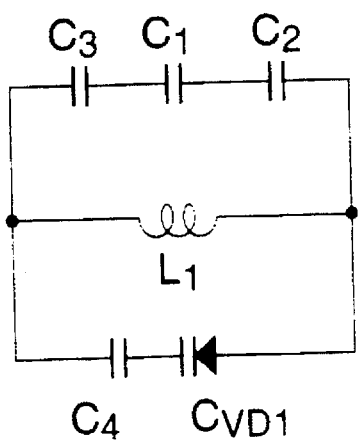
FIG. 14 is an equivalent circuit diagram showing a resonance portion of the conventional VCO circuit.

In the first, second and third embodiments, the variable capacitance diode CVD2 is connected in series with or in parallel to the condenser C3. However, since the VCO circuit of the clamp circuit can be represented as shown in FIGS. 13 and 14, when the variable capacitance diode CVD2 is connected in series with or in parallel to the condenser C1, or the condenser C2 connected in series with the inductance L1 shown in FIG. 14, an adjustment similar to the first three embodiments can be performed.

Figure 9:
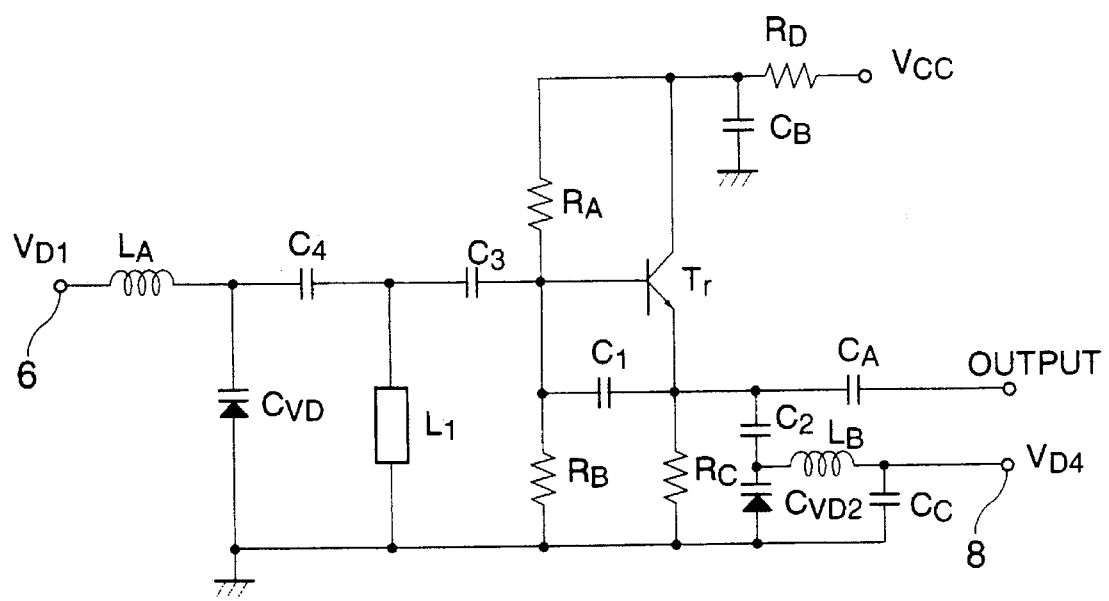
FIG. 9 is a VCO circuit diagram according to a fourth embodiment of the invention.

In the fourth embodiment shown in FIG. 9, the same reference numerals as in FIG. 8 represent the same or substantially similar components. In FIG. 9, the variable capacitance diode CVD2 is connected in series with the condenser C2. The adjustment voltage VD4 is applied between the variable capacitance diode CVD2 and the condenser C2 so that the relation between the control voltage VD1 and the oscillation frequency f0 can be adjusted.

In the construction shown in FIG. 9, the variable capacitance diode CVD2 is connected in series with the condenser C2. However, even if the variable capacitance diode CVD2 is connected in series with or in parallel to the condensers C1 and C3, an effect similar to the first three embodiments can be accomplished.

Figure 10:
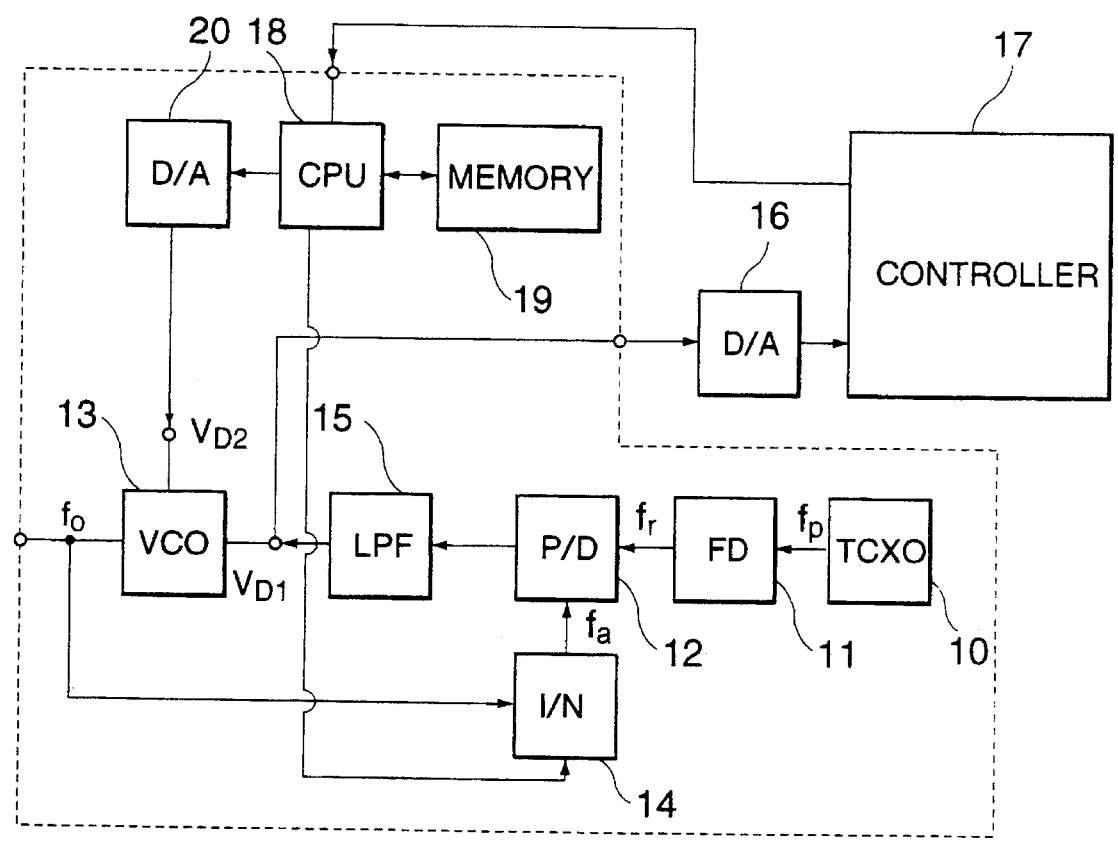
FIG. 10 is a PLL circuit diagram including a VCO circuit according to an application of the invention.
Figure 11:
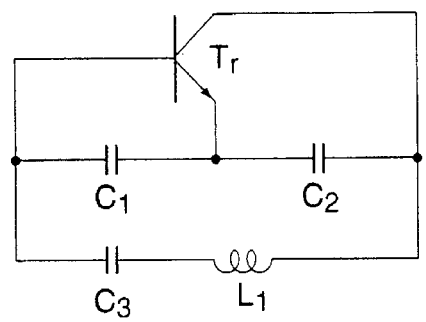
FIG. 11 is a clamp circuit diagram for explaining a basic VCO circuit.

Next, a PLL circuit having a VCO circuit according to an embodiment of the invention will be described. In FIG. 10, the PLL circuit comprises an oscillator TCXO 10 outputting a reference frequency fp, a fixed-frequency divider FD 11, a phase comparator P/D 12, a VCO circuit 13 as shown in FIG. 8, a programmable frequency divider I/N 14 that divides the oscillation frequency f0 of the VCO circuit 13 by N, a low-pass filter LPF 15 for smoothing the output voltage of the phase comparator 12 and outputting the control voltage VD1, an A/D converter 16 independent of the PLL circuit for converting the analog control voltage VD1 into a digital signal, a controller 17 independent of the PLL circuit for causing the PLL via a CPU 18 to output the oscillation frequency f0 and causing the CPU 18 to output a digital value to a D/A converter 20, a memory 19 for storing the digital value of the adjustment voltage VD2, with which the control voltage VD1 and the oscillation frequency f0 of the VCO circuit 13 have a predetermined relation, and the D/A converter 20 for converting the digital adjustment voltage VD2 stored in the memory 19 into an analog signal. The adjusting circuit that outputs the adjustment voltage VD2 comprises the CPU 18, the memory 19, and the D/A converter 20.

In operation, the reference frequency fp that is output from the oscillator 10 is divided by the fixed-frequency divider 11 into fr, and then input to the phase comparator 12. The oscillation frequency f0 of the VCO circuit 13 is divided in the programmable frequency divider 14 by N into fa, and then input to the comparator 12. The frequencies fr and fa are compared by the phase comparator 12 and a pulse corresponding to the phase difference is output (when fr>fa, a positive voltage is output, when fr<fa, a GND voltage is output; when fr=fa, OPEN). The output is smoothed by the low-pass filter 15 and the control voltage VD1 is applied to the control terminal 6 of VCO circuit shown in FIG. 8. When VD1 increases, f0 increases, and vice versa. When the system is stable, a relation of f0=N×fr is obtained.

Figure 15:
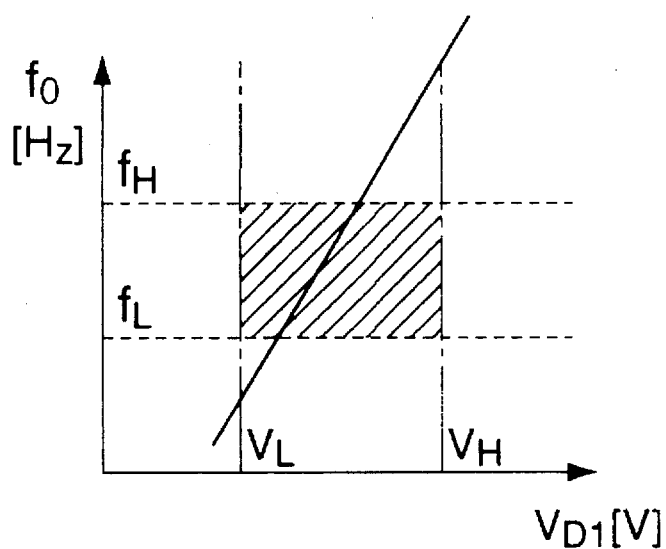
FIG. 15 is a diagram for explaining the relation between a control voltage and an oscillation frequency of the VCO circuit of both the present invention and the conventional VCO circuit.

Now, assume that the PLL circuit is a synthesizer, and requires that f0<fL when VD1=VL and f0>fH when VD1=VH as shown in FIG. 15 (where the range of the oscillation frequency f0 is between fL to fH; the range of the control voltage VD1 is between VL and VH). In this case, when an oscillation frequency fM in the vicinity of the middle of fL and fH is commanded to the VCO circuit 13 and VM=(VL+VH)/2, the controller 17 causes the CPU 18 to instruct the oscillation frequency fM. The controller 17 receives the control voltage VD1 that is fed back from the A/D converter 16 to the controller 17. Next, the controller 17 outputs the command to the CPU 18 to increase the adjustment voltage VD2 when VD1>VM and to decrease the adjustment voltage VD1 when VD1<VM, so that the control voltage VD1 becomes (VM−ΔV<VD1<VM+ΔV), which is close to VM. The digital value of the D/A converter 20 when VM−ΔV<VD1<+ΔV is usually stored in the memory 19. When the value of the adjustment voltage VD2 is constant, values in the middle of the region fL~fH of the oscillation frequency f0 and the range of VL~VH of the control voltage VD1 are realized. The VCO circuit 13 thus oscillates at the predetermined frequency f0 with the control voltage VD1. Thus, the fabrication yield of the VCO circuit 13 with the above-described performance requirements is improved. In addition, the required capability of the PLL circuit can be satisfied.

As described above, when a dedicated controller 17 and an A/D converter 16 are provided as external devices and embody software that outputs an adjustment voltage VD2 to the CPU 18 of the PLL circuit in such a manner that the control voltage VD1 becomes close to VM corresponding to the oscillation frequency fM commanded by the controller, the relation between the control voltage VD1 and the oscillation frequency f0 can be easily adjusted.

The invention has been described with respect to certain preferred embodiments. Various modifications and additions within the spirit of the invention will occur to those of skill in the art. Accordingly, the scope of the invention is limited solely by the following claims.

I claim:
1. A VCO circuit, comprising:
 a) a first voltage variable capacitance device [(CVD1)] for varying a resonance frequency of a resonance circuit comprising a fixed capacitance device connected in series with an inductance device [(L1)], b) a second voltage variable capacitance device [(CVD2)] connected to said fixed capacitance device, and c) means for applying an adjustment voltage to said second voltage variable capacitance device to adjust for fluctuations in the relation between a control voltage [(VD1)] applied to the first voltage variable capacitance device and a resonance frequency [(f0)] of said resonance circuit;

said fixed capacitance device comprising a series circuit of first, second, and third capacitors, and said second voltage variable capacitance device is directly coupled in parallel to one of the first, second, and third capacitors to form a parallelly coupled connection which is serially connected to said inductor.

2. The VCO circuit of claim 1, wherein said means for applying an adjustment voltage to said second voltage variable capacitance device comprises DC voltage generating means.

3. A VCO circuit, comprising:

a) a first voltage variable capacitance device for varying a resonance frequency of a resonance circuit comprising a fixed capacitance device connected in series with an inductance device, b) a second voltage variable capacitance device connected to said fixed capacitance device, and c) means for applying an adjustment voltage to said second voltage variable capacitance device to adjust for fluctuations in the relation between a control voltage applied to the first voltage variable capacitance device and a resonance frequency of said resonance circuit;

wherein said fixed capacitance device comprises a series circuit of first, second, and third capacitors, and said second voltage variable capacitance device is connected in parallel to one of the first, second, and third capacitors.

4. The VCO circuit of claim 3, wherein a cathode of said second voltage variable capacitance device is connected in series with a fourth capacitor, and said adjustment voltage is applied to the cathode of said second voltage variable capacitance device through a shunt coil.

5. The VCO circuit of claim 1, wherein said inductance device is connected in parallel to a series circuit of the first voltage variable capacitance device and a capacitor, the control voltage being applied to a connecting point of the first voltage variable capacitance device and the capacitor through a shunt coil.

6. The VCO circuit of claim 1, wherein said adjustment voltage is applied to a cathode of said second voltage variable capacitance device through a shunt coil.

7. The VCO circuit of claim 1, wherein said inductance device comprises one of a coil, a microstrip line, a dielectric resonator, a surface elastic wave resonator, and a crystal resonator.

8. The VCO circuit of claim 2, wherein said DC voltage generating means comprises a control unit for outputting a predetermined digital signal, and a D/A converter for converting said digital signal into an analog signal.

9. The VCO circuit of claim 1, wherein a predetermined DC voltage is applied as said adjustment voltage.

10. A PLL circuit employing a VCO circuit, comprising:

a) a VCO circuit [(13)] having a first voltage variable capacitance device for varying a resonance frequency of a resonance circuit comprising a fixed capacitance device connected in series with an inductance device, a second voltage variable capacitance device connected to said fixed capacitance device, and means for applying an adjustment voltage to said second voltage variable capacitance device to adjust for fluctuations in the relation between a control voltage applied to the first voltage variable capacitance device and a resonance frequency of said resonance circuit, b) a reference frequency oscillator [(10)] for oscillating a reference frequency;

c) a fixed-frequency divider [(11)] for dividing the reference frequency;

d) a variable frequency divider [(14)] for dividing an oscillation frequency of the VCO circuit;

e) a phase comparator [(12)] for comparing the phase of the frequency divided by said variable frequency divider with the phase of the frequency divided by said fixed-frequency divider;

f) a filter [(15)] for applying a control voltage based on a smoothed output of said phase comparator to the first voltage variable capacitance device of the VCO circuit; and g) an adjusting circuit [(18,19,20)] for comparing the oscillation frequency of the VCO circuit, corresponding to an external controller [(17)] command, with the control voltage output by said filter, and outputting the adjustment voltage to be applied to said second voltage variable capacitance device of the VCO circuit to cause the control voltage output by said filter to be in a predetermined voltage range when the VCO oscillates at a predetermined frequency.

11. The PLL circuit employing a VCO circuit of claim 10, wherein said adjusting circuit outputs the adjustment voltage in such a manner that the control voltage output by said filter lies proximate the middle of a control voltage range for the VCO circuit when a frequency proximate the middle of an oscillation frequency range is oscillated by the VCO circuit.

12. The VCO circuit as claimed in claim 1, further comprising a fourth capacitor which is directly coupled in series to said second voltage variable capacitance device, such that said series of said second voltage variable capacitance device and said fourth capacitor is directly coupled across said one of said first, second and third capacitors.

13. The VCO circuit as claimed in claim 12, wherein an anode of said second voltage variable capacitance device is directly connected to a terminal of said one of said first, second and third capacitors, and a terminal of said fourth capacitor is directly connected to the other terminal of said one of said first, second and third capacitors.

14. The VCO circuit as claimed in claim 3, further comprising a fourth capacitor which is directly coupled in series to said second voltage variable capacitance device, such that said series of said second voltage variable capacitance device and said fourth capacitor is directly coupled across said one of said first, second and third capacitors.

15. The VCO circuit as claimed in claim 14, wherein an anode of said second voltage variable capacitance device is directly connected to a terminal of said one of said first, second and third capacitors, and a terminal of said fourth capacitor is directly connected to the other terminal of said one of said first, second and third capacitors.

16. The VCO circuit as claimed in claim 8, wherein said DC generating means further comprises a resistor and a condenser for reducing noise of the analog signal.

* * * * *